(12) United States Patent
Klocek

(10) Patent No.: US 11,266,022 B2
(45) Date of Patent: Mar. 1, 2022

(54) ANISOTROPIC ETCHING USING PHOTOPOLYMERIZABLE COMPOUND

(71) Applicant: AT&S Austria Technologie & Systemtechnik Aktiengesellschaft, Leoben (AT)

(72) Inventor: Jolanta Klocek, Niklasdorf (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/929,753

(22) Filed: May 20, 2020

(65) Prior Publication Data
US 2020/0383210 A1    Dec. 3, 2020

(30) Foreign Application Priority Data

May 27, 2019 (EP) .................................. 19176797

(51) Int. Cl.
*H05K 3/06* (2006.01)
*C23F 1/16* (2006.01)
(Continued)

(52) U.S. Cl.
CPC ............... *H05K 3/067* (2013.01); *C23F 1/16* (2013.01); *H05K 1/09* (2013.01); *H05K 1/181* (2013.01);
(Continued)

(58) Field of Classification Search
CPC .... H05K 1/02; H05K 1/09; H05K 1/181–182; H05K 3/064; H05K 3/067;
(Continued)

(56) References Cited

U.S. PATENT DOCUMENTS

| 4,376,056 A | 3/1983 | Erdman |
| 4,497,687 A | 2/1985 | Nelson |

(Continued)

FOREIGN PATENT DOCUMENTS

| EP | 0465229 A1 | 1/1992 |
| JP | 2004221450 A | 8/2004 |

(Continued)

OTHER PUBLICATIONS

Dardel, Blaise; Extended European Search report in Application No. 19176797.9; pp. 1-6; dated Nov. 29, 2019; European Patent Office; 80298, Munich, Germany.
(Continued)

*Primary Examiner* — Tuan T Dinh
(74) *Attorney, Agent, or Firm* — Robert A. Blaha; Smith Tempel Blaha LLC

(57) ABSTRACT

A method of etching an electrically conductive layer structure during manufacturing a component carrier is provided. The method includes carrying out a first etching of at least one exposed region of an electrically conductive layer structure by a first etching composition having a photo-hardenable compound to thereby form a recess in the electrically conductive layer structure, hardening the photo-hardenable compound by irradiation with photons selectively on an upper side wall portion of the recess to thereby cover the upper side wall portion with a photo-hardened compound, carrying out a second etching by a second etching composition selectively on a side wall portion and/or bottom portion of the recess being not covered with the photo-hardened compound, and subsequently removing the photo-hardened compound from the side wall portion. In addition, a component carrier is provided.

12 Claims, 4 Drawing Sheets

114
Etching with first etching composition with photo-hardenable compound

114
Exposure to irradiation

(51) Int. Cl.
*H05K 1/09* (2006.01)
*H05K 1/18* (2006.01)
*H05K 3/26* (2006.01)

(52) U.S. Cl.
CPC .............. *H05K 1/182* (2013.01); *H05K 3/064* (2013.01); *H05K 3/26* (2013.01); *H05K 2203/0766* (2013.01)

(58) Field of Classification Search
CPC ............. H05K 3/26; H05K 2203/0121; H05K 2203/0384; H05K 2203/0766; H05K 2203/1184; H05K 2203/125; C23F 1/00; C23F 1/02; C23F 1/16
USPC ......... 361/761, 767, 792–794; 174/258–264; 439/713–714, 723, 725
See application file for complete search history.

(56) References Cited

U.S. PATENT DOCUMENTS

| | | | |
|---|---|---|---|
| 4,859,281 A | 8/1989 | Goltz | |
| 6,733,886 B2 | 5/2004 | Kawaguchi et al. | |
| 7,150,820 B2 | 12/2006 | Hu et al. | |
| 7,547,504 B2* | 6/2009 | Sreenivasan | B82Y 10/00 216/44 |
| 7,704,678 B2* | 4/2010 | Yoo | B41C 1/025 430/302 |
| 9,627,444 B2* | 4/2017 | Kim | C23C 14/042 |
| 2004/0056330 A1 | 3/2004 | Egitto et al. | |
| 2006/0127690 A1* | 6/2006 | Ueda | C23F 1/02 428/596 |
| 2006/0199394 A1* | 9/2006 | Takahashi | H01L 21/32134 438/754 |
| 2008/0121621 A1 | 5/2008 | Stockum et al. | |
| 2013/0015444 A1* | 1/2013 | Hirai | C23C 14/042 257/57 |
| 2013/0092657 A1 | 4/2013 | Gillies et al. | |
| 2014/0173462 A1* | 6/2014 | Mattingly | G06F 3/04847 715/753 |
| 2019/0003061 A1 | 1/2019 | Michalik et al. | |

FOREIGN PATENT DOCUMENTS

| | | |
|---|---|---|
| KR | 101385284 B1 | 4/2014 |
| WO | 2017108513 A1 | 6/2017 |

OTHER PUBLICATIONS

Antonijevic, Milan M. et al.; Films Formed on Copper Surface in Chloride Media in the Presence of Azoles; Corrosion Science, vol. 51, Issue 6, Jun. 2009, pp. 1228-1237.

* cited by examiner

Ideal (anisotropic) etching process

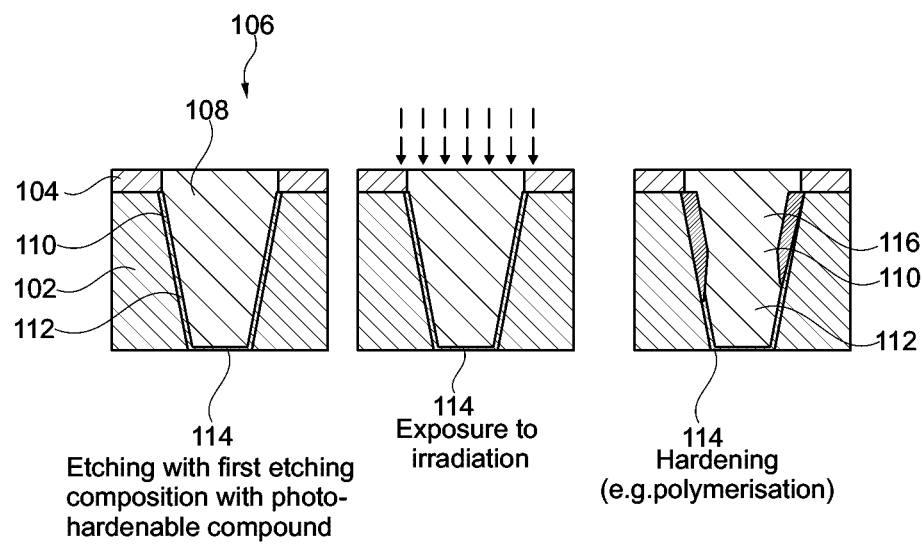
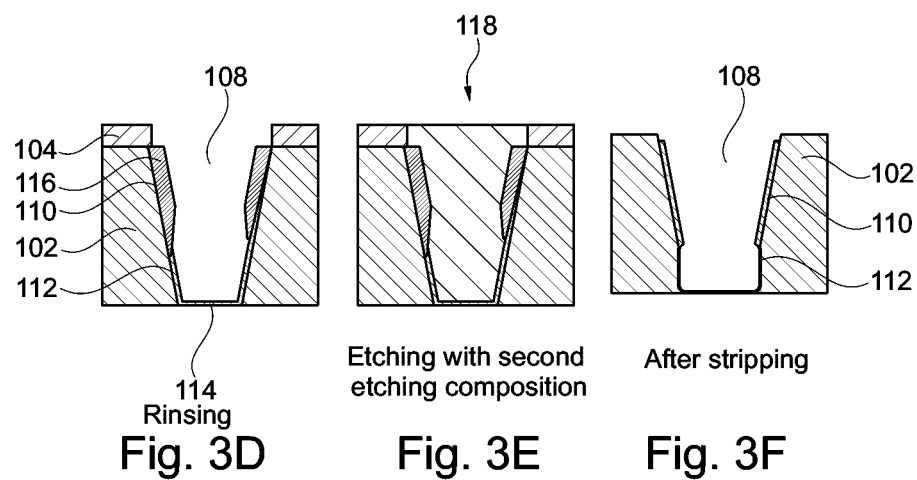

Standard etching solution with photopolymerizable monomers → Exposure → Rinse → Standard etching solution

US 11,266,022 B2

ANISOTROPIC ETCHING USING PHOTOPOLYMERIZABLE COMPOUND

CROSS-REFERENCE TO RELATED APPLICATIONS

This application claims the benefit of the filing date of the European Patent Application No. 19 176 797.9, filed May 27, 2019, the disclosure of which is hereby incorporated herein by reference.

TECHNICAL FIELD

Embodiments of the invention relate to a method of etching an electrically conductive layer structure (hereinafter, also simply referred to as an "etching process"), and a component carrier.

BACKGROUND

In the context of growing product functionalities of component carriers equipped with one or more components and increasing miniaturization of such components as well as a rising number of components to be mounted on component carriers such as printed circuit boards (PCBs), increasingly more powerful array-like components or packages having several components are being employed, which have a plurality of contacts or connections, with ever smaller spacing between these contacts.

The PCB industry is in particular confronted with the task to adapt the size of the produced printed circuit boards to comply with the miniaturization requirements. Due to the new dimensions of the circuit paths, drill holes and their distance from each other, it is necessary to implement new etching techniques, in particular new copper etching processes. Although the copper etching process is one of the most important steps in the manufacture of printed circuit boards, processing of copper during fabrication is still a challenging task. In a conventional isotropic copper etching process as shown in FIG. 1, when a copper film to be etched formed on a substrate and partly covered by a mask (as a negative template for patterning) is etched, undercuts may be formed beneath the mask due to isotropic etching, resulting in poor adhesion. In addition, isotropic etching may not be capable of forming very fine etching structures, but isotropic etching may be blocked by respective, fine masks structures.

The generation of fine structures with circuit paths of 30 microns and below may require an anisotropic etching process. In case of printed circuit boards, it is desired that the etching (in particular the copper removal) occurs more in the vertical direction rather than in the lateral direction. Hereby, regular structures may be obtained and short circuits may be avoided. An ideal anisotropic etching process is shown in FIG. 2, wherein the etching exclusively occurs in the vertical direction, but not in the lateral direction of the PCB so that no undercuts are formed.

SUMMARY

There may be a need to provide an etching process allowing an anisotropic etching of an electrically conductive layer structure during manufacturing a component carrier and to obtain a respective component carrier having at least partly (preferably completely, i.e. along the entire depth) substantially vertical side walls, thereby increasing the overall quality of a component carrier, such as a printed circuit board.

According to exemplary embodiments, a method of etching an electrically conductive layer structure during manufacturing a component carrier, and a component carrier according to the independent claims are provided.

According to an exemplary embodiment of the invention, a method of etching an electrically conductive layer structure during manufacturing a component carrier comprises carrying out a first etching of at least one exposed region of the electrically conductive layer structure by a first etching composition comprising a photo-hardenable (photocurable, photopolymerizable) compound to thereby form a recess (cavity) in the electrically conductive layer structure, hardening (curing, polymerizing) the photo-hardenable compound by irradiation with photons (energy-carrying activation beam, electromagnetic radiation) selectively on an upper side wall portion of the recess to thereby cover the upper side wall portion with a photo-hardened (photocured, photopolymerized) compound, carrying out a second etching by a second etching composition selectively on a (lower) side wall portion and/or bottom portion of the recess being not covered with the photo-hardened compound, and subsequently removing (such as stripping) the photo-hardened compound from the side wall portion.

According to another exemplary embodiment of the invention, a component carrier is provided, wherein the component carrier comprises a stack comprising at least one electrically conductive layer structure and at least one electrically insulating layer structure, wherein at least one of the at least one electrically conductive layer structure comprises a recess having a lower portion with substantially vertical sidewalls and having a tapering upper portion connected to the lower portion.

According to an exemplary embodiment of the invention, an etching process is provided wherein a sequence of process steps are carried so that an anisotropic etching may be achieved. In particular, a photo-hardenable compound may be blended to a first etching composition forming a recess in an electrically conductive layer structure. By selectively irradiating the first etching composition including the photo-hardenable compound in an upper portion of the recess, in particular at an upper side wall of the recess, the photo-hardenable compound may harden and adhere to an upper side wall of the recess, thereby forming a layer of photo-hardened material on the upper side wall of the recess which may act as a protection layer and may prevent a further etching at the upper side wall, whereas a lower side wall portion and/or bottom portion of the recess, which has not been sufficiently irradiated with photons for causing a substantial hardening of photo-hardenable compound may not be covered with photo-hardened compound. Thus, in a further etching step, the upper side wall of the recess covered (protected) by the photo-hardened compound will not be significantly etched, but predominantly the lower side wall portion and/or bottom portion of the recess will be etched by a further (second) etching composition so that the etching may proceed anisotropically mainly in a vertical direction. As a result, a recess having a lower portion with substantially vertical sidewalls and having a tapering upper portion connected to the lower portion may be obtained.

Overview of Embodiments

In the following, further exemplary embodiments of the method of etching an electrically conductive layer structure, and the component carrier will be explained. However, the present invention is not limited to the following specific descriptions of exemplary embodiments, but they are rather for illustrative purposes only.

It should be noted that features described in connection with one exemplary embodiment or exemplary aspect may be combined with any other exemplary embodiment or exemplary aspect, in particular features described with any exemplary embodiment of an etching process may be combined with any other exemplary embodiment of an etching process and any exemplary embodiment of a component carrier and vice versa, unless specifically stated otherwise.

Where an indefinite or definite article is used when referring to a singular term, such as "a", "an" or "the", a plural of that term is also included and vice versa, unless specifically stated otherwise, whereas the word "one" or the number "1", as used herein, typically means "just one" or "exactly one".

It should be noted that the term "comprising" does not exclude other elements or steps and, as used herein, includes not only the meaning of "comprising", "including" or "containing", but may also encompass "consisting essentially of" and "consisting of".

Unless specifically stated otherwise, the expressions "at least partially", "at least partly", "at least part of" or "at least a part of", as used herein, may mean at least 1% thereof, in particular at least 5% thereof, in particular at least 10% thereof, in particular at least 15% thereof, in particular at least 20% thereof, in particular at least 25% thereof, in particular at least 30% thereof, in particular at least 35% thereof, in particular at least 40% thereof, in particular at least 45% thereof, in particular at least 50% thereof, in particular at least 55% thereof, in particular at least 60% thereof, in particular at least 65% thereof, in particular at least 70% thereof, in particular at least 75% thereof, in particular at least 80% thereof, in particular at least 85% thereof, in particular at least 90% thereof, in particular at least 95% thereof, in particular at least 98% thereof, and may also include 100% thereof.

In the context of the present application, the term "etching composition" may particularly denote a fluid, such as a solution or a liquid, which is capable of at least partly etching (dissolving) an electrically conductive material, such as a metal, in particular—but not limited to—copper, aluminum, nickel or silver. To this end, the etching composition may in particular comprise an etchant (etching agent) representing a reactive component of the composition substantially responsible for the at least partly etching (dissolving) an electrically conductive material. The etching compositions may be prepared by dissolving the various ingredients, as exemplified in further detail in the following, in an appropriate solvent, such as water and/or an organic solvent. The method of etching may thus be a wet etching process.

In the context of the present application, the term "photo-hardenable compound" may particularly denote a compound having photoreactive (photolabile) functional groups, i.e. functional groups that may be caused or activated by irradiation with photons or an energy-carrying activation beam to undergo a chemical reaction. In an embodiment, the photo-hardenable compound may be a photopolymerizable compound, i.e. a compound that undergoes a polymerization reaction upon irradiation with photons. In particular, a photo-hardenable compound may be transformed (such as hardened or cured) to a photo-hardened compound by means of irradiation with photons.

In an embodiment, the method of etching an electrically conductive layer structure during manufacturing a component carrier may further comprise (in particular prior to the first etching) patterning a mask layer (in particular a dry film photoresist) on the electrically conductive layer structure to thereby expose at least one region of the electrically conductive layer structure. By taking this measure, particular regions of the electrically conductive layer structure, which regions are to be etched, may be defined in an efficient manner. For example, patterning a mask layer may involve a photolithographic structuring of an electrically conductive layer structure of a component carrier by means of a photoresist, which may include applying a photoresist layer on the electrically conductive layer structure, partly exposing the photoresist through a mask to electromagnetic radiation (such as UV light), followed by developing, thereby removing that part of the photoresist that has been exposed to the electromagnetic radiation or, alternatively, removing that part of the photoresist that has not been exposed to the electromagnetic radiation.

In an embodiment, the method of etching an electrically conductive layer structure during manufacturing a component carrier comprises carrying out a first etching of at least one exposed region of the electrically conductive layer structure by a first etching composition comprising a photo-hardenable (photocurable, photopolymerizable) compound to thereby form a recess (cavity) in the electrically conductive layer structure.

In an embodiment, the first etching composition may comprise an etchant, in particular cupric chloride ($CuCl_2$), and optionally at least one of hydrochloric acid (HCl), ozone, and oxygen. Alternatively, the etchant may also comprise ferric chloride ($FeCl_3$) or an alkaline etchant may be employed, too. It might be advantageous if the first etching composition comprises oxygen, because oxygen may act as an inhibitor of free-radical polymerization, thereby assuring stability of the first etching composition.

In addition, the first etching composition comprises a photo-hardenable compound. While not excluded, the photo-hardenable compound does not need to exhibit etching properties or other properties directly influencing the etching of the electrically conductive layer structure by means of the first etching composition. Nevertheless, in an embodiment, the photo-hardenable compound may be configured for inhibiting copper (such as complexing copper ions) and/or accelerating etching, which may increase the anisotropy of the etching process.

In an embodiment, the photo-hardenable compound comprises at least one photopolymerizable monomer and/or photopolymerizable oligomer. In particular, the photo-hardenable compound may comprise a monomer or oligomer which may undergo a radical (e.g. a free-radical) polymerization upon irradiation with photons. By taking this measure, an efficient, selective and fast transformation of the photo-hardenable compound into a photo-hardened compound may be achieved by irradiation with photons.

In an embodiment, the photopolymerizable monomer and/or oligomer may comprise at least one (meth)acrylic compound. A "(meth)acrylic compound" may encompass an acrylic compound and/or a methacrylic compound. In particular, the photopolymerizable monomer and/or oligomer may comprise at least one compound selected from the group consisting of monovinyl (meth)acrylate, (meth)acrylamides, urea (meth)acrylamides, carbonate (meth)acrylates and mixtures thereof.

In an embodiment, the photo-hardenable compound comprises a material (such as monomers) similar to (preferably substantially the same) as contained in a dry film photoresist, which may be used for patterning.

In an embodiment, the photo-hardenable compound is configured for adhering to an etched surface. For instance, the photo-hardenable compound may have functional groups which may promote adherence to an etched surface. By taking this measure, a photo-hardened compound formed from the photo-hardenable compound by irradiation with photon may directly adhere to a side wall of an etched recess, thereby efficiently forming a protection layer on the side wall and prevent a further etching at that side wall part in a subsequent (second) etching step.

In an embodiment, the photo-hardenable compound is contained in the first etching composition in a concentration of from 0.001 g/l to 30 g/l, in particular of from 0.1 g/l to 5 g/l.

In an embodiment, the carrying out the first etching may comprise a spraying the first etching composition on the at least one exposed region of the electrically conductive layer structure.

In an embodiment, the method of etching an electrically conductive layer structure during manufacturing a component carrier comprises hardening (curing, polymerizing) the photo-hardenable compound by irradiation with photons (energy-carrying activation beam, electromagnetic radiation) selectively on an upper side wall portion of the recess to thereby cover the upper side wall portion with a photo-hardened (photocured, photopolymerized) compound.

In an embodiment, the photons are UV radiation, for instance electromagnetic radiation having a wavelength of from 100 nm to 400 nm. By taking this measure, an efficient and fast transformation (for instance photo-polymerization) of the photo-hardenable compound into a photo-hardened compound may be achieved by irradiation with photons.

In an embodiment, the irradiation with photons may be accomplished by means of a UV radiation source, in particular a tunable (fine-adjustable) UV radiation source.

In an embodiment, the selectively hardening the photo-hardenable compound and/or the selectively covering only the upper side wall portion of the recess with the photo-hardened compound is carried out by adjusting the irradiation energy and/or the incidence angle (inclination angle) of the photons. For example, the irradiation energy may be adjusted to a (relatively low) irradiation energy, such that an irradiation energy sufficient for hardening the photo-hardenable compound may only reach an upper portion of the recess, whereas in a lower or bottom portion of the recess the irradiation energy may be reduced (for instance by absorption or scattering) to such an extent that a hardening reaction (such as a photo-polymerization) may not be initiated. As a result, only the upper side wall portion of the recess may be covered with the photo-hardened compound and protected from further etching in a subsequent (second) etching step. Such a (relatively low) irradiation energy may be appropriately adjusted depending on the etching composition, the dimensions of the etched structures and other processing factors, as would be readily apparent to a person skilled in the art. As a further example, by adjusting the incidence angle of the photons (for instance to an oblique or inclined angle of incidence), it may be possible to only irradiate an upper portion of the recess, but not a lower or bottom portion of the recess. Descriptively speaking, the incidence angle of the photons may be adjusted such that the upper edge of the recess may cast a shadow over the lower or bottom portion of the recess. As a result, the hardening of the photo-hardenable compound may only be initiated and may only occur at an upper side wall portion of the recess so that only the upper side wall portion of the recess may be covered with the photo-hardened compound and protected from further etching in a subsequent (second) etching step, but not the lower side wall portion and/or bottom portion of the recess.

In an embodiment, the method of etching an electrically conductive layer structure during manufacturing a component carrier may further comprise (in particular after hardening the photo-hardenable compound and prior to the second etching) rinsing (i.e. a first rinsing step) the first etching composition out of the recess. For instance, rinsing may be carried out by applying (for instance spraying or dipping) a rinsing liquid. The first rinsing step may be configured to substantially completely remove the first etching composition, in particular of any (unreacted) photo-hardenable compound, from the recess. On the other hand, the first rinsing step may preferably not remove the photo-hardened compound covering an upper side wall portion of the recess.

In an embodiment, the method of etching an electrically conductive layer structure during manufacturing a component carrier comprises carrying out a second etching by a second etching composition selectively on a side wall portion and/or bottom portion of the recess being not covered with the photo-hardened compound.

In an embodiment, the second etching composition may comprise an etchant, in particular cupric chloride ($CuCl_2$), and optionally at least one of hydrochloric acid (HCl), ozone, and oxygen. Alternatively, the etchant may also comprise ferric chloride ($FeCl_3$) or an alkaline etchant may be employed, too.

In an embodiment, the second etching composition may substantially correspond to the first etching composition (for instance, after a part of the photo-hardenable compound originally contained in the first etching composition has been transformed to a photo-hardened compound). In particular, the second etching composition may be the same as the first etching composition or may be derived from the first etching composition (i.e. after a part of the photo-hardenable compound originally contained in the first etching composition has been transformed to a photo-hardened compound). By taking this measure, the above discussed first rinsing step may be dispensable, thereby reducing the number of process steps and consequently simplifying the etching process. Rather, the first etching composition may remain in the recess even after completing the hardening step involving selective coverage of only the upper side wall portion of the recess with photo-hardened compound, thereby becoming the second etching composition (i.e. so that the first etching composition becomes the second etching composition), and the second etching step may be carried out making use of a puddling effect. Any remaining unreacted photo-hardenable compound in the second etching composition (stemming from the first etching composition) does not disturb the second etching, at least as long a further irradiation of the second etching composition is omitted.

In an alternative embodiment, the second etching composition may be substantially free of a photo-hardenable compound, in contrast to the first etching composition. In this embodiment, it may be advantageous to carry out the above discussed first rinsing step. In the context of the present application, the term "substantially free of a photo-hardenable compound" may particularly denote that no photo-hardenable compound at all is contained or if any photo-hardenable compound is contained (for example due to technical (unavoidable) reasons), it is contained in an amount that does not influence the second etching.

Without wishing to be bound to any theory, it is believed that the second etching composition (of both embodiments discussed above) may only etch that side wall portion (in particular the side walls at a lower portion of the recess) and/or bottom portion of the recess being not covered with the photo-hardened compound, whereas that side wall portion of the recess (in particular the side walls at an upper portion of the recess) being covered with the photo-hardened compound is substantially protected from being etched by the second etching composition. As a result, the etching may substantially only proceed at a lower or bottom portion of the recess, i.e. in a vertical direction of the recess, rather than in a lateral direction, thereby increasing the anisotropy of the etching process.

In an embodiment, the second etching composition further comprises a surface-active agent, such as a surfactant. Hereby, an exchange of components on surfaces may be improved. The surfactant may be at least one selected from the group consisting of an anionic surfactant, a cationic surfactant, a nonionic surfactant and a zwitterionic surfactant. In particular, the surfactant may be at least one selected from the group consisting of an anionic surfactant, a cationic surfactant and a nonionic surfactant. More specifically, the surfactant may be at least one of an anionic surfactant and a cationic surfactant and even more specifically the surfactant may comprise an anionic surfactant. Moreover, also the photo-hardenable compound (for instance any remaining unreacted photo-hardenable compound in the second etching composition stemming from the first etching composition) may have surface-active properties and may thus act as a surfactant.

In an embodiment, the carrying out the second etching comprises a spraying the second etching composition into the recess in the electrically conductive layer structure.

In an embodiment, the method of etching an electrically conductive layer structure during manufacturing a component carrier may further comprise (in particular after the second etching and prior to removing the photo-hardened compound) rinsing (i.e. a second rinsing step) the second etching composition out of the recess. For instance, rinsing may be carried out by applying (for instance spraying or dipping) a rinsing liquid. The second rinsing step may be configured to substantially completely remove the second etching composition from the recess. While not required, but in contrast to the first rinsing step, the (second) rinsing step may also remove at least part of the photo-hardened compound covering an upper side wall portion of the recess.

In an embodiment, the method of etching an electrically conductive layer structure during manufacturing a component carrier comprises removing (such as stripping) the photo-hardened compound from the side wall portion. By taking this measure, the side walls of the recess may be freed from substantially any photo-hardened compound so as to obtain clean and uncovered side walls of the recess.

In an embodiment, the method of etching an electrically conductive layer structure during manufacturing a component carrier may further comprise (in particular after the second etching and after, simultaneously or prior to removing the photo-hardened compound) removing the mask layer, if applied. Thus, the photo-hardened compound and the mask layer (if applied) may be removed in the same or in separate process steps.

In an embodiment, the sequence of process steps as discussed in the foregoing may be repeated several times, for instance at least once, such as at least twice, in particular at least three times. Hereby, still deeper anisotropic etching structures may be formed.

In an embodiment, the electrically conductive layer structure is subjected to a subtractive etching procedure, in particular a subtractive wet etching procedure. Thus, the etching process may be a subtractive etching process.

In an embodiment, the component carrier comprises a stack comprising at least one electrically conductive layer structure and at least one electrically insulating layer structure, wherein at least one of the at least one electrically conductive layer structure comprises a recess having a lower portion with substantially vertical sidewalls and having a tapering upper portion connected to the lower portion.

In an embodiment, an angle (a) between the lower portion (with substantially vertical sidewalls) and the tapering upper portion is from 120° to less than 180°, in particular from 150° to 175°.

In an embodiment, a ratio of the top width (or top diameter) to the bottom width (or bottom diameter) of the recess is not more than 1:0.5, in particular not more than 1:0.6, in particular not more than 1:0.75 and preferably close to 1:1 (i.e. a substantially rectangular shape).

In an embodiment, the recess of the at least one electrically conductive layer structure of the component carrier may be formed by an etching process as described herein.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (teflon®), a ceramic, and a metal oxide. Teflon® is a registered mark of the Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the exemplary embodiments to be described hereinafter and are explained with reference to these exemplary embodiments.

BRIEF DESCRIPTION OF THE DRAWINGS

FIG. 3A, FIG. 3B, FIG. 3C, FIG. 3D, FIG. E to FIG. 3F illustrate a sequence of process steps of an etching process according to an exemplary embodiment of the invention.

DETAILED DESCRIPTION OF EXEMPLARY EMBODIMENTS

Figure 1:
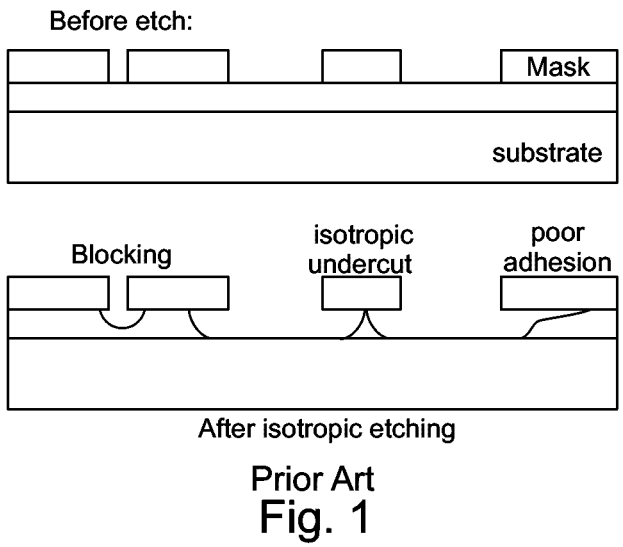
FIG. 1 illustrates a conventional isotropic copper etching process according to the prior art.
Figure 2:
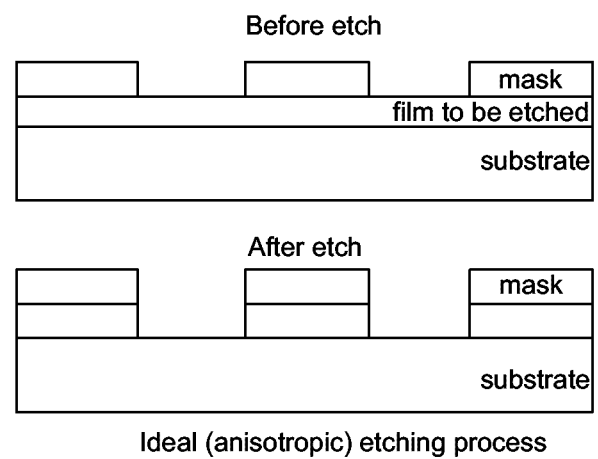
FIG. 2 illustrates an ideal anisotropic copper etching process.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a method of etching an electrically conductive layer structure during manufacturing a component carrier is provided wherein a sequence of specific process steps are carried out. In particular, in a first etching step (preferably after a mask layer have been patterned on the electrically conductive layer structure so as to defined exposed regions of the electrically conductive layer structure to be etched) a recess may be formed at exposed regions of the electrically conductive layer structure by an etching composition which besides an etchant further includes a photo-hardenable compound. Subsequently, the recess while still filled with the (first) etching composition is selectively irradiated with light, such as UV light. In other words, only a part of the recess, more specifically an upper portion of the recess, is selectively irradiated with light, whereas as another part of the recess, more specifically a lower or bottom portion of the recess is not or only insufficiently irradiated with light. Upon irradiation with light, the photo-hardenable compound, which may in particular be a photopolymerizable compound, becomes hardened or cured. Since only the upper portion of the recess is sufficiently irradiated for causing a photochemical reaction by which the photo-hardenable compound is hardened, a layer of photo-hardened material may only be formed on an upper side wall of the recess which may act as a protection layer and which may prevent a further subsequent etching at the upper side wall, whereas a lower side wall portion and/or bottom portion of the recess, which has not been sufficiently irradiated with photons for causing a substantial hardening of photo-hardenable compound may not be covered with photo-hardened compound. Thus, in a further etching step, the upper side wall of the recess covered (protected) by the photo-hardened compound will not be significantly etched, but predominantly the lower or bottom portion of the recess will be etched by a further (second) etching composition so that the etching may proceed in a vertical direction, rather than in a lateral direction of the recess. As a consequence, an anisotropic etching may result and a recess having a lower portion with substantially vertical sidewalls and having a tapering upper portion connected to the lower portion may be obtained. As a result, the overall quality of a component carrier, such as a printed circuit board, may be increased, in particular in terms of a decreased defect rate as well as an improved etching distribution (increased homogeneity) within the produced boards and a higher etching factor of etched structures. In addition, a line width lower than 50 µm, such as 30 µm or less, may be achieved.

FIGS. 3A to 3F illustrate a sequence of process steps of an etching process according to an exemplary embodiment of the invention. More specifically, a subtractive wet etching process is illustrated. Initially, a laminate or stack of an electrically insulating layer structure (such as made of a dielectric) (not shown in FIG. 3) and an electrically conductive layer structure (such as made of copper) 102 to be etched is provided. A mask layer 104, such as a photoresist layer, is patterned on the electrically conductive layer structure 102 thereby exposing specific regions of the electrically conductive layer structure 102 to be etched.

Referring to FIG. 3A, a first etching composition 106 is applied to an exposed region (i.e. uncovered with the mask layer 104) of the electrically conductive layer structure 102, thereby etching a recess 108 having an upper side wall portion 110, a lower side wall portion 112 and a bottom portion 114 into the electrically conductive layer structure 102. The first etching composition 106 contains in addition to an etchant, such as cupric chloride ($CuCl_2$), a photo-hardenable compound, which may adhere to an etched surface of the recess 108.

Referring to FIG. 3B, the thus formed recess 108 while still filled with the first etching composition 106 containing the photo-hardenable compound is irradiated with photons (as indicated with dashed arrows), thereby initiating a transformation (for instance a photopolymerization) of the photo-hardenable compound into a photo-hardened compound. In the depicted embodiment, the irradiation is performed with a relatively low irradiation energy such that an irradiation energy sufficient for hardening the photo-hardenable compound only reaches an upper portion of the recess 108, whereas in a lower or bottom portion 114 of the recess 108 the irradiation energy is reduced to such an extent that a hardening reaction may not be initiated. In an alternative to the depicted embodiment, an incidence angle of the photons may be set such that only an upper portion of the recess is irradiated, but not a lower or bottom portion of the recess.

Referring to FIG. 3C, as a result of the irradiation with photons as shown in FIG. 3B, a layer of photo-hardened compound 116 is formed on the upper side wall portion 110 of the recess 106, whereas the lower side wall portion 112 and the bottom portion 114 remains uncoated with photo-hardened compound.

Referring to FIG. 3D, a rinsing step is carried out removing the first etching composition from the recess 108. However, the layer of photo-hardened compound 116 formed on the upper side wall portion 110 of the recess 106 remains on the upper side wall portion 110 as a coating or coverage after the rinsing.

Referring to FIG. 3E, a second etching composition 118 is applied into the recess 108. The second etching composition 118 contains an etchant, such as cupric chloride ($CuCl_2$), but is substantially free from a photo-hardenable compound. Since the upper side wall portion 110 of the recess 108 is covered by the layer of photo-hardened compound 116, it is protected from etching by the second etching composition 118. On the other hand, the lower side wall portion 112 and the bottom portion 114 of the recess 108 which are not covered with the photo-hardened compound 116 may be attacked unhinderedly by the second etching composition and thus are further etched.

Referring to FIG. 3F, after a further rinsing step removing the second etching composition from the recess 108, the layer of photo-hardened compound 116 and the mask layer 104 are removed, for instance by stripping. As a result, an electrically conductive layer structure 102 comprising a recess 108 having a lower portion 112 with substantially vertical sidewalls and having a tapering upper portion 110 connected to the lower portion 112 is obtained.

Figure 4:
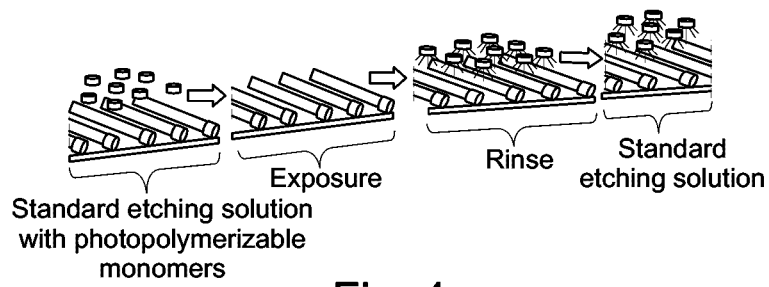
FIG. 4 illustrates an etching apparatus or equipment suitable for carrying out an etching process according to an exemplary embodiment of the invention.

FIG. 4 illustrates an etching apparatus or equipment suitable for carrying out an etching process according to an exemplary embodiment of the invention. The etching apparatus 100 shown in FIG. 4 comprises four modules. A component carrier comprising an electrically conductive layer structure to be etched (not shown in FIG. 4) can be transported from one module to the other. The first module as shown in FIG. 4 on the left-hand side comprises spaying nozzles and is configured for applying a first etching composition comprising photopolymerizable monomers (on)to the electrically conductive layer structure of the component carrier. The second module comprises an irradiation unit (such as a UV source, not shown in FIG. 4) and is configured for irradiating the etched electrically conductive layer structure with photons. The third module comprises spaying nozzles and is configured for rinsing the first etching composition away. The fourth module comprises spaying nozzles and is configured for applying a second etching composition, such as a standard etching solution without photopolymerizable monomers (on)to the etched electrically conductive layer structure of the component carrier, in particular into the previously etched recesses in the electrically conductive layer structure of the component carrier. The etching apparatus may comprise further modules, such as modules configured for rinsing the second etching composition away or for stripping any photo-hardened material, as will be evident for a person skilled in the art from the above description of an etching process according to an exemplary embodiment of the invention.

Figure 5:
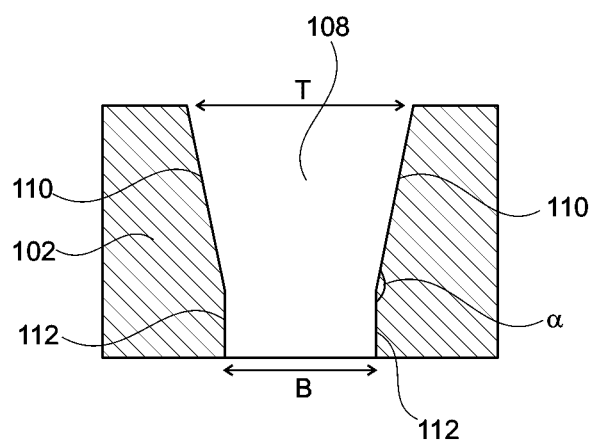
FIG. 5 illustrates a cross-sectional view of a recess in an electrically conductive layer structure of a component carrier according to an exemplary embodiment of the invention.

FIG. 5 illustrates a cross-sectional view of a recess 108 in an electrically conductive layer structure 102 of a component carrier according to an exemplary embodiment of the invention. The electrically conductive layer structure 102 comprises a recess 108 having a lower portion 112 with substantially vertical sidewalls and having a tapering upper portion 110 connected to the lower portion 112. An angle a between the lower portion 112 (with substantially vertical sidewalls) and the tapering upper portion 110 is from 120° to less than 180°, in particular from 150° to 175°. A ratio of the top width or top diameter (T) to the bottom width or bottom diameter (B) of the recess 108 is not more than 1:0.5, in particular not more than 1:0.6, in particular not more than 1:0.75 and preferably close to 1:1 (i.e. a substantially rectangular shape).

Figure 6:
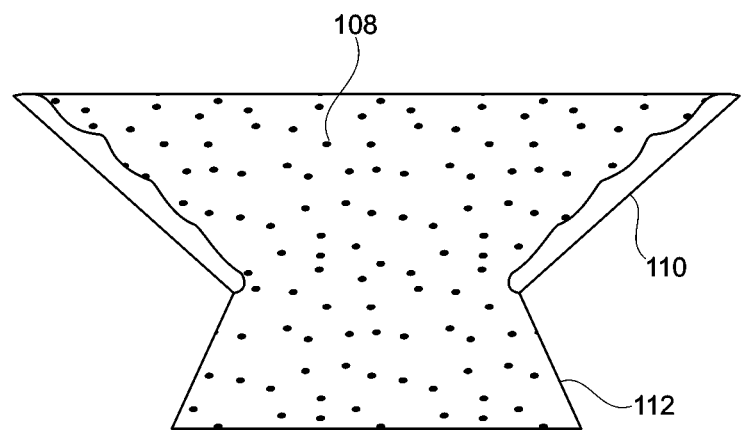
FIG. 6 illustrates a cross-sectional view of a recess in an electrically conductive layer structure of a component carrier according to another exemplary embodiment of the invention.

FIG. 6 illustrates a cross-sectional view of a recess 108 in an electrically conductive layer structure of a component carrier according to another exemplary embodiment of the invention. In this embodiment, the recess 108 has a lower portion 112 which is slightly (outward) tapering, in contrast to the embodiment shown in FIG. 5, and a tapering upper portion 110 similar to the embodiment shown in FIG. 5.

Implementation of the invention is not limited to the preferred embodiments shown in the figures and described above. Instead, a multiplicity of variants is possible which use the solutions shown and the principle according to the invention even in the case of fundamentally different embodiments.

REFERENCE SIGNS

102 Electrically conductive layer structure
104 Mask layer
106 First etching composition
108 Recess
110 Upper side wall portion
112 Lower side wall portion
114 Bottom portion
116 Photo-hardened compound
118 Second etching composition
α Angle between lower side wall portion and tapering upper side wall portion
B Bottom width or bottom diameter
T Top width or top diameter

The invention claimed is:

1. A method of etching an electrically conductive layer structure during manufacturing a component carrier, the method comprising:
   carrying out a first etching of at least one exposed region of an electrically conductive layer structure by a first etching composition comprising a photo-hardenable compound to thereby form a recess in the electrically conductive layer structure;
   hardening the photo-hardenable compound by selective irradiation with photons on an upper side wall portion of the recess to thereby cover the upper side wall portion with a photo-hardened compound;
   carrying out a second selective etching by a second etching composition on a side wall portion and/or bottom portion of the recess being not covered with the photo-hardened compound; and
   subsequently removing the photo-hardened compound from the side wall portion.

2. The method according to claim 1, further comprising:
   patterning a mask layer on the electrically conductive layer structure to thereby expose the at least one region of the electrically conductive layer structure.

3. The method according to claim 1, wherein the first etching composition and/or the second etching composition comprise an etchant, in particular cupric chloride ($CuCl_2$), and optionally at least one of hydrochloric acid (HCl), ozone, and oxygen.

4. The method according to claim 1, wherein the photo-hardenable compound comprises at least one photopolymerizable monomer and/or a photopolymerizable oligomer.

5. The method according to claim 4, wherein the photopolymerizable monomer and/or oligomer comprises at least one (meth)acrylic compound, in particular at least one compound selected from the group consisting of monovinyl (meth)acrylate, (meth)acrylamides, urea (meth)acrylamides, and carbonate (meth)acrylates.

6. The method according to claim 1, wherein the photo-hardenable compound is configured for adhering to an etched surface.

7. The method according to claim 1, wherein selectively covering only the upper side wall portion of the recess with the photo-hardened compound is carried out by adjusting the irradiation energy and/or the incidence angle of the photons.

8. The method according to claim 1, further comprising:
   rinsing the first etching composition out of the recess.

9. The method according to claim 1, wherein the second etching composition is substantially free of the photo-hardenable compound.

10. The method according to claim 1, wherein the second etching composition substantially corresponds to the first etching composition.

11. The method according to claim 1, further comprising:
    rinsing the second etching composition out of the recess.

12. The method according to claim 2, further comprising:
    removing the mask layer.

* * * * *